United States Patent [19]

Salkeld et al.

[11] Patent Number: 5,413,648
[45] Date of Patent: May 9, 1995

[54] PREPARATION OF SINGLE CRYSTAL SUPERALLOYS FOR POST-CASTING HEAT TREATMENT

[75] Inventors: Richard W. Salkeld, South Windsor; Thomas T. Field, Killingly; Earle A. Ault, South Windsor, all of Conn.

[73] Assignee: United Technologies Corporation, Hartford, Conn.

[21] Appl. No.: 565,999

[22] Filed: Dec. 27, 1983

[51] Int. Cl.⁶ .................... C21D 6/02; C22F 1/10
[52] U.S. Cl. .................. 148/562; 204/129.46; 117/3
[58] Field of Search ........... 148/2, 11.5 N, 562; 204/129.46; 156/654, 656; 437/245, 248, 986; 117/3

[56] References Cited

U.S. PATENT DOCUMENTS

| | | | |
|---|---|---|---|
| 3,057,764 | 10/1962 | La Boda et al. | 156/654 X |
| 3,494,709 | 2/1970 | Piearcey | 416/232 |
| 3,576,070 | 4/1971 | Parsons | 29/558 |
| 3,873,512 | 3/1975 | Latanision | 204/129.46 |
| 4,116,723 | 9/1978 | Gell et al. | 148/404 X |
| 4,209,348 | 6/1980 | Duhl et al. | 148/410 X |
| 4,345,950 | 8/1982 | O'Hara | 148/2 |

FOREIGN PATENT DOCUMENTS 568207  3/1945  United Kingdom ........... 204/129.46

Primary Examiner—Richard D. Lovering
Attorney, Agent, or Firm—Charles E. Sohl

[57] ABSTRACT

Unwanted recrystallization during heat treatment of a directionally solidified nickel alloy single crystal casting is prevented by chemical milling the part before heat treatment. Removal of a layer of as little as 0.013–0.050 mm thick, less than two percent of the part thickness, has been found effective.

3 Claims, No Drawings

PREPARATION OF SINGLE CRYSTAL SUPERALLOYS FOR POST-CASTING HEAT TREATMENT

TECHNICAL FIELD

The present invention relates to directionally solidified superalloy castings, in particular to post-casting procedures which provide optimum properties.

BACKGROUND

The process of directional solidification involves the controlled cooling of castings so that they solidify continuously from one end of the mold to the other. Castings made by directional solidification either have columnar grain or a single grain as shown in U.S. Pat. No. 3,260,505 to Ver Snyder and U.S. Pat. No. 3,494,709 to Piearcey. The process has been applied with great utility to the manufacture of turbine blades for aircraft gas turbine engines. In this, the procedures for casting have been highly refined in order to optimize the yield and properties of castings. U.S. Pat. Nos. 4,190,094 to Giamei, 3,700,023 to Giamei et al, 3,931,847 to Terkelsen and patent application Ser. No. 409,785, now U.S. Pat. No. 4,450,889, to Grot generally indicate the procedures used.

In conventional casting, the metal solidifies in a matter of seconds or minutes inasmuch as the mold is substantially below the melting point of the metal. In contrast, in directional solidification the mold is in a furnace at a temperature above the melting point of the metal when the metal is introduced. Solidification is initiated at the end of the mold, usually due to the presence of a water cooled chill plate. The mold is then progressively withdrawn from the furnace to cause a thermal gradient to move along the length of the casting, thereby causing solidification. Casting times usually range from 10 minutes or more for a typical part.

There have been a number of problems connected with directional solidification which have been solved over the past 20 years. In large measure they have related to low yields of good castings because of grain structure or metallurgical interaction between the mold and metal.

The unique grain structure is the essence of directional solidified castings and the present invention is concerned with obtaining such. In columnar grain castings there are no grain boundaries transverse to the direction of the primary stress in a gas turbine blade. However, since a columnar grain part is still a polycrystal, the alloy of such parts contains grain boundary strengtheners to provide strength transverse to the grain direction. See U.S. Pat. No. 3,700,433 to Duhl. Single crystal castings have in essence one grain and permit the removal of the grain boundary strengtheners. This enables even higher strength as described below.

Like their polycrystalline forebearers, the alloys used in single crystal superalloy aircraft engine blades are nickel base and strengthened by a gamma prime precipitate. It is necessary to heat treat a single crystal superalloy casting at a high temperature after casting in order to obtain good properties. In the heat treatment at or above the gamma prime solvus, the casting is made more homogeneous to ameliorate the affects of the dendritic structure which is formed as a natural result of the casting procedure. Upon cooling a fine gamma prime precipitate is formed to provide the desired strength. As mentioned, it is the absence of the grain boundary strengtheners which enables single crystal superalloys to be heated to the required very high temperature without undergoing incipient melting. See U.S. Pat. No. 4,116,723 to Gell et al.

However, should there inadvertently be created a grain boundary in a single crystal casting, the casting is greatly weakened. Inasmuch as the common superalloy grain boundary strengtheners such as carbon, boron, hafnium, etc., are omitted, the grain boundary will exhibit extremely poor strength at elevated temperatures. The casting procedure is of course designed to avoid the creation of grain boundaries, in accord with the teachings of the patents referred to.

But, after casting the ceramic shell mold which adheres to the casting, and usually core material as well, must be removed from the casting. This is commonly undertaken by mechanical means and by caustic chemical immersion which attacks the ceramic but does not attack the metal. See U.S. Pat. No. 4,073,662 to Borom for a special example of such process. Next, the castings are subjected to the high temperature homogenization and solutioning heat treatment. If during the processing prior to this heat treatment the castings are hit against one another, or otherwise impacted, residual stress regions can be created. Upon exposure to the elevated temperature, these regions will be found to recrystallize. If this occurs in a region of the casting which is subjected to high stress (which comprises most aircraft blade regions) then the part must be discarded as unuseable because it may fail prematurely along the recrystallization formed grain boundaries. Single crystal superalloy castings are very expensive and such occurrences are to be avoided through substantial efforts. Despite efforts to minimize impact damage, recrystallization apparently attributable to this cause has been a continuing problem during the manufacture of experimental parts. While in experimental manufacture the resultant lower yields could be accepted (despite efforts to overcome the problem) now that single crystal superalloy turbine blades are coming into commercial production, there has been a greater need to solve the problem. The work which resulted in the invention was undertaken. But, recrystallization problems arose in the casting of parts that were normally processed and which could not be attributed to mechanical mishandling. The cause became mysterious. Recrystallization was noticed in the region where the airfoil portion of a blade transitions to a larger flange section. Recrystallization was also noticed in the vicinity of a slight gibbosity on the surface as a result of the use of soluble metal for holding delicate cores in place, in accord with the teachings of U.S. Pat. No. 3,596,703 to Bishop.

Basically, residual casting stress was not judged to be an apparent cause of the recrystallization. The inherent nature of the directional solidification process and the variability in occurrence of the recrystallization suggested this. There was a tendency to nonetheless attribute the recrystallization to untraceable impact damage during handling. The rationale was as follows: In conventional casting it is well understood that residual casting stresses arise principally in two ways: First, the metal solidifies relatively rapidly from the free surface inward, producing compressive stresses on the surface of the casting. Second, after solidification there is contraction of the metal which is greater than that of the typical ceramic mold, thereby producing thermal strains when there is mechanical restraint of the metal part within the ceramic mold.

But, in directional solidification these effects were not seen to be present in sufficient degree: First, the molten metal solidifies progressively along the length of the mold and there is no mechanism for producing compressive surface stresses. Second, the presence of substantial restraint was not apparent since the investment molds were relatively thin and fragile, and the metals very strong. Furthermore, the recrystallization associated with the pin residues and the variability in recrystallization from one production run to another introduced clouded any residual strain hypothesis. But certain recrystallized regions tended to extend substantially or totally through airfoil walls (typically 3 mm thick) suggesting a substantial rather than superficial effect.

Thus, prior to the present invention the cause of the recrystallization was a mysterious problem which several people in the technical community concerned with the production of superalloy gas turbine parts concerned themselves with.

DISCLOSURE OF INVENTION

An object of the invention is to provide an effective way of preparing castings for high temperature heat treatment after directional solidification, to prevent recrystallization.

According to the invention a thin surface layer of a casting is removed prior to heat treatment by a method such as chemical milling which avoids inducing deleterious plastic strains into the new surface layer thus created. In a nickel base superalloy, the amount of material typically removed is in the range 0.013–0.050 mm. The layer removed comprises that material which is prone to recrystallization. In a typical nickel alloy this means it is the layer which has plastic deformation damage equivalent to that caused in a tensile specimen plastically strained by about two percent or more.

If one assumes logically that the material removed is that which has been strain damaged as a result of differential contraction between the metal and the mold during casting, then the elimination of recrystallization by the invention is very surprising inasmuch as one would assume the strained material would extend through the casting thickness. Instead, in the invention it is found that for a typical nickel superalloy gas turbine engine blade less than 2 percent of the thickness of the part must be removed.

Different combinations of machining methods and depths of material removal may be used, provided the residual damage on the new surface of the casting is below the critical level. While a general machining process such as chemical milling is preferred, in other practices of the invention localized machining may be used.

The foregoing and other objects, features and advantages of the present invention will become more apparent from the following description of the best mode.

BEST MODE FOR CARRYING OUT THE INVENTION

The invention is described in terms of the processing of a hollow turbine blade made of the commercial nickel alloy known as PWA 1480 of Pratt & Whitney Aircraft, East Hartford, Connecticut, USA. The alloy is generally described in U.S. Pat. No. 4,209,348 to Schweizer and typically has a composition by weight percent of 10 Cr, 5 Co, 4 W, 1.5 Ti, 12 Ta, 5 Al, balance Ni. This alloy is subjected to a typical post-casting heat treatment at a temperature in excess of 1280° C. It will be understood that the invention will include application to columnar grain and single crystal parts of other metals which are prone to recrystallization during heat treatment subsequent to a directional casting process.

Single crystal castings are made generally as described above and as taught in the patents mentioned above, the disclosures of which are hereby incorporated by reference. Single crystal growth is obtained either by utilization of the zig zag passage shown in U.S. Pat. No. 3,494,709 to Piearcey, the helical passage described in U.S. patent application Ser. No. 409,785 of Grot, filed Aug. 20, 1982 and now U.S. Pat. No. 4,450,889or by seeding as described in U.S. Pat. No. 4,412,577 to Salkeld et al, the disclosures of which are hereby incorporated by reference. Subsequent to solidification, the mold is removed from the furnace and the ceramic mold material adhering to the cast metal is mechanically removed from it, using processes such as very light hammering or vibrating, water blasting, light sandblasting, etc. If, as is common, there is a ceramic core in the interior of the casting, this will be removed by a combination of mechanical and chemical processing, typically caustic leaching. These post-casting ceramic removal processes typically are chosen to minimize any attack on or removal of metal surface, and to avoid the imparting of plastic strain.

In the practice of the invention, the blade casting is next chemically milled, preferably by anodic etching the part in an aqueous solution comprised by volume of 70% concentrated phosphoric acid, using a current of $620/m^2$ for 3 minutes. Next, the part is immersed for 4–5 minutes in a 65°±2° C. solution comprised by volume parts of 2 concentrated nitric acid, 80 muriatic acid of about 32% concentration, and 11 water, to which has been added 61 kg of anhydrous ferric chloride. An alternate procedure to the foregoing two steps is to immerse the part for 3–5 minutes in a warm solution comprised by volume percent of 90 concentrated hydrochloric acid and 10 hydrogen peroxide. The etchant and chemical milling procedure are especially selected to produce a uniform attack and to avoid intergranular or undue preferential attack of the separate phases in the cast alloy. A layer of at least about 0.013 mm and up to about 0.05 mm thickness is removed from the exterior surface of a typical hollow casting having a wall thickness of about 3.2 mm. This comprises removal of a layer which is small percent of the wall thickness, about 0.5–2 percent. (In fact, the hollow airfoils we have processed have the general configuration shown in U.S. Pat. No. 4,278,400 to Yamarik et al and thus the milling solution fills the interior. But because of stagnation of the solution negligible removal occurs. However, if recrystallization appeared to be initiating at the interior we would chemically mill the interior by flowing etchant vigorously therethrough.) Then, the casting is rinsed, dried and subjected to the homogenization heat treatment in a vacuum or inert atmosphere furnace.

The homogenization heat treatment is conducted at a temperature sufficiently high to solution the gamma prime. For the alloy PWA 1480 this temperature typically will be 1282°–1290° C., with even slightly higher temperatures being useable. It is during this procedure that there is sufficient thermal activation to cause the nucleation and growth of extraneous crystals, i.e., recrystallization. By recrystallization is meant the formation of new strain-free grain structures from those which pre-exist. The recrystallization referred to herein is "normal recrystallization", characterized in a superalloy by occurring during heating to a temperature sufficiently high to dissolve the gamma prime precipitate strengthening phase. The dissolution of the gamma prime is done for purposes of chemical homogenization of the material and to enable subsequent precipitation of a fine gamma prime structure. However, an important incidental effect is that the mobility of grain boundaries, such as those formed during recrystallization, is greatly enhanced. Normal recrystallization is contrasted with cellular recrystallization which can occur at a lower temperature and at a substantially slower rate. In cellular recrystallization the gamma prime phase is still present and the grain boundary moves through the structure by progressive dissolution and reprecipitation of the gamma prime as the grain boundary passes through a given location. The invention is principally directed toward preventing normal recrystallization but it incidentally will reduce the propensity for the less troublesome but nonetheless unwanted cellular recrystallization.

The prevention of recrystallization by removing such a small amount of surface material was surprising and we did various experiments and metallurgical evaluations, as now described in part. Blades were solution heat treated both with and without our above-described chemical milling procedure. Those which were not milled tended to recrystallize while those which were chemically milled had a low propensity for recrystallization. In our invention, the tendency for recrystallization will be mostly but may not entirely be eliminated. There are evidently variations in the severity of residual stress and in our procedure for practical reasons we remove a constant small amount from every part in a lot.

In Laue x-ray analysis we found that as-cast blades produced Laue images which were of very poor resolution in the regions where recrystallization subsequently occurred. By this we mean that the characteristic dot pattern resulting on a film due to x-ray reflection from crystallographic planes and the dot images were relatively fuzzy and of low contrast with the background. This is indicative of relatively high residual stresses, compared to the low residual stresses in other recrystallization resisting regions of the casting where the Laue image was good. By this we mean it is characterized by a regular pattern of clearly defined dots, similar to results typical of annealed face centered cubic metals. Thus, in our invention the layer which ought to be removed is that which produces an unclear Laue pattern, compared to that which produces a clear pattern substantially like that of cast metal which is not prone to recrystallization. Transmission electron microscope (TEM) analysis revealed a high density of dislocations in the gamma matrix of parts prone to recrystallize. The dislocation density was estimated to be of the order of $10^{11}$ cm$^{-2}$. Lower density, less than about $4\times10^{10}$ cm$^{-2}$, characterizes material not prone to recrystallize.

Alloy PWA 1480 test specimens were variously strained tensilely at room temperature and heat treated to observe whether or not recrystallization occurred. Based on such tests we have concluded that if the residual plastic strain, i.e., the permanent deformation, is less than 1.5%, then recrystallization will not occur. When the residual strain is in the range of 2.5–10%, recrystallization will quite surely result. In the range 1.5–2.5 there is a very strong likelihood that recrystallization will occur.

By direct analogy the recrystallization which occurs in castings is dependent on a similar degree of strain damage based on the following rationale. The straining which occurs in a metal part during the casting process occurs at a high temperature and slow rate, compared to the tensile specimen straining. The strain rate during casting cooldown is unknown but it is likely there is some creep with accompanying recovery and relaxation. Accordingly, the damage (as measured by dislocation density, etc.) associated with a given percent strain caused by the casting process will be less than the damage associated with the same percent strain in a tensile test at room temperature. Nonetheless, as far as is presently known in the field of metallurgy, the damage associated with a tendency for recrystallization will be similar regardless of whether the dislocations were induced at a low temperature and high strain rate or at a high temperature and slow rate. (Unfortunately, it is not possible to quantify strain damage in single crystal superalloys with accuracy at the present time.) Thus, the percent plastic deformation in a casting layer prone to recrystallization will be greater than the plastic deformation in a similar tensile specimen layer. But in the invention it can still be said that the layer which must be removed is the layer which has damage equivalent to that which is induced by about two percent or more room temperature tensile straining.

Thus, in the general mode of our invention, we remove whatever thickness layer is necessary to remove from the surface that material which has a residual stress sufficient to promote recrystallization upon high temperature exposure. We determined that the material to be removed can be characterized as that which exhibits an unclear Laue pattern. Alternatively stated, it is that layer which has more permanent deformation than that equivalent to about 2 percent room temperature tensile strain; preferably the layer removed is that which has more than 1–1.5% strain. In our nickel base superalloy single crystal cast blades the layer is typically 0.013–0.05 mm thick, and we believe this quantity is pertinent to analogous parts of other like alloys.

The invention's success is quite surprising since it would not appear that removal of such a small layer of the surface of the casting would provide such a dramatic improvement. While chemical milling which we disclose herein is well suited to economic removal of small surface layers, other means for removing a slight amount of material from the surface of the casting may be utilized so long as the resultant new free surface does not have residual strains sufficient to cause recrystallization. Thus, very gentle abrasive machining can be used, such as results by using 240 grit abrasive paper or compound. On the other hand, heavy grinding or milling are to be avoided.

Thus, in general the means employed to remove the surface layer must be one which avoids inducing significant residual strain in the new surface. By significant residual strain is meant strain which is above the level which causes recrystallization in the alloy and which is a result of the combination of initial casting processes and surface layer removal process. The easiest procedure is to chemically mill the article over its entire surface. However, if recrystallization is prevalent in a particular location then only that portion of the casting need be machined. This can be effected by concentrating the machining method in the particular region.

The invention is most useful with single crystal castings but is also pertinent to columnar grain castings. Even though these alloys have grain boundary strengtheners in them, recrystallization is still a problem since the grain boundaries which are created by recrystallization are characterized by low strength. They are different in character from the normal longitudinal grain boundaries formed during solidification in that they lack the substantial quantities of grain boundary strengtheners such as carbides, borides, etc., which provide strength.

Although this invention has been shown and described with respect to a preferred embodiment, it will be understood by those skilled in the art that various changes in form and detail thereof may be made without departing from the spirit and scope of the claimed invention.

We claim:

1. The method of making a single crystal superalloy part from a gamma-gamma prime type nickle alloy which comprises
    directionally solidifying the part from molten metal in a ceramic mold, to form the part, the part having a surface with strain damage greater than that cause by 2 percent tensile strain;
    removing a layer from the surface of the part to create a new surface using a process which leaves strain damage less than that caused by 2 percent tensile strain in the new surface, to remove material from the part which could be prone to recrystallization;
    heat treating the part at a temperature above the superalloy recrystallization temperature, to homogenize the alloy and solution the gamma prime without forming grains by recrystallization; and
    cooling the part to precipitate a gamma prime phase.

2. The method of claim 1 characterized in that chemical milling is used to remove the layer.

3. The method of claim 1 characterized by heat treating the part at 1280° C. or higher.

* * * * *